(12) United States Patent
Vetter et al.

(10) Patent No.: US 7,106,594 B2
(45) Date of Patent: Sep. 12, 2006

(54) SIMPLIFIED MOUNTING CONFIGURATION THAT APPLIES PRESSURE FORCE TO ONE CENTRAL LOCATION

(75) Inventors: Stephan Michael Vetter, Lockport, NY (US); Mark Joseph Parisi, East Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 178 days.

(21) Appl. No.: 10/946,860

(22) Filed: Sep. 22, 2004

(65) Prior Publication Data

US 2006/0061972 A1    Mar. 23, 2006

(51) Int. Cl.
*H05K 7/20* (2006.01)

(52) U.S. Cl. ............ 361/719; 361/704; 257/718; 257/719; 165/80.3

(58) Field of Classification Search ........ 361/702–704; 257/718, 719; 174/16.3; 165/80.3, 185
See application file for complete search history.

(56) References Cited

U.S. PATENT DOCUMENTS

| | | | | |
|---|---|---|---|---|
| 5,305,185 A | | 4/1994 | Samarov | 361/704 |
| 5,932,925 A | | 8/1999 | McIntyre | 257/719 |
| 6,483,708 B1 | * | 11/2002 | Ali et al. | 361/719 |
| 6,552,905 B1 | | 4/2003 | Herring | 361/704 |
| 6,639,800 B1 | * | 10/2003 | Eyman et al. | 361/704 |
| 6,665,188 B1 | * | 12/2003 | Chen | 361/719 |
| 6,771,500 B1 | * | 8/2004 | Siegel et al. | 361/699 |
| 7,019,395 B1 | * | 3/2006 | Hirano et al. | 257/717 |
| 2002/0196614 A1 | | 12/2002 | DiBene | 361/760 |

* cited by examiner

*Primary Examiner*—Boris Chérvinsky
(74) *Attorney, Agent, or Firm*—Patrick M. Griffin

(57) ABSTRACT

A heat transfer assembly comprising of an electronic component attached to an attachment point located on a circuit board and a clamping mechanism which applies a downward force against a block. In return, the block applies force against a heat transfer device which contacts the electronic component. The interface between the block and the heat transfer device contain a number of tongues and grooves to allow for positive location of the block against the heat transfer device while the clamping mechanism is fastened to the support. The positive location is configured for applying a localized force against a specific area on the electronic component.

14 Claims, 3 Drawing Sheets

SIMPLIFIED MOUNTING CONFIGURATION THAT APPLIES PRESSURE FORCE TO ONE CENTRAL LOCATION

BACKGROUND OF THE INVENTION

1. Field of the Invention

The present invention relates to mounting a block on a heat transfer device, and more particularly, for proper placement of the block over the heat transfer device to increase thermal transfer between an electronic component and heat transfer device.

2. Description of the Related Art

Typically, removing heat generated from electronic components is a primary concern particularly when electronic components are located in enclosures with poor to little ventilation. Failure to remove excess heat results in malfunction of the electronic component. By attaching a heat transfer device to an electronic component, the device will transfer thermal energy away from the electronic component. A heat transfer device can consist of a simple piece of metal or a cold plate. Fans used in conjunction with metal heat transfer devices circulate hot air away from the electronic component. A cold plate heat transfer device consists of a pair of hoses and an inlet and outlet tube which allows liquid coolant to pass through it. As hot air is transferred from the electronic component through the base of the cold plate, liquid coolant entering an inlet valve of the cold plate removes the hot air and passes it through an outlet valve. Liquid coolant is applied to the cold plate through a hose attached to the inlet valve. Likewise, an additional hose is connected to the outlet valve for removing the liquid coolant from the cold plate. In either type of heat transfer device used, it is critical that sufficient pressure is applied the heat transfer device to ensure adequate contact with the electronic component.

Prior art heat sink assemblies disclose a number of ways of forcing a heat transfer device against an electronic component to ensure sufficient contact and pressure. To provide for adequate contact and pressure between the electronic component and a heat transfer device, a clamping mechanism applies a downward force that forces the heat transfer device against the electronic component.

An example of such a heat sink assembly is disclosed in the U.S. Pat. No. 6,665,188 to Chen. The Chen patent discloses two contact members that engage with each other and are moveable over the surface of the heat transfer device. Each contact member has a bolt and arm to facilitate moving the contact members against each other. As the two contact members engage one another, a downward force is applied against the heat sink, which applies a force against the electronic component and establishes contact between the heat sink and the electronic component. The dialing of the bolts is time consuming and may not reliably ensure sufficient contact during mass production of heat sink assemblies. Therefore, what is needed is a heat sink assembly that can distribute sufficient force across a heatsink to a localized position of the electronic component reliably and in a timely manner for mass production. Particularly when localized regions of the electronic component generate more heat than other regions.

BRIEF SUMMARY OF THE INVENTION AND ADVANTAGES

The present invention provides a heat transfer assembly for increasing thermal energy transfer comprising an electronic component and a circuit board including an attachment point for supporting the electronic component. Additionally, a heat transfer device having a first and second side is placed against the electronic component for transferring thermal energy away from the electronic component. A block is placed over the first side of the heat transfer device and a clamping mechanism interacts between a support and the block for urging the heat transfer device against the electronic component. A locating mechanism for locating the block on the heat transfer device is used to ensure positive location between the heat transfer device and the electronic component for optimizing thermal transfer between the heat transfer device and the electronic component. Particularly, if specific areas of the electronic component generate more heat than other areas and the objective is to optimize thermal transfer over a localized area of the electronic component.

BRIEF DESCRIPTION OF THE SEVERAL VIEWS OF THE DRAWINGS

Other advantages of the present invention will be readily appreciated as the same becomes better understood by reference to the following detailed description when considered in connection with the accompanying drawings wherein.

DETAILED DESCRIPTION OF THE INVENTION

Figure 1:
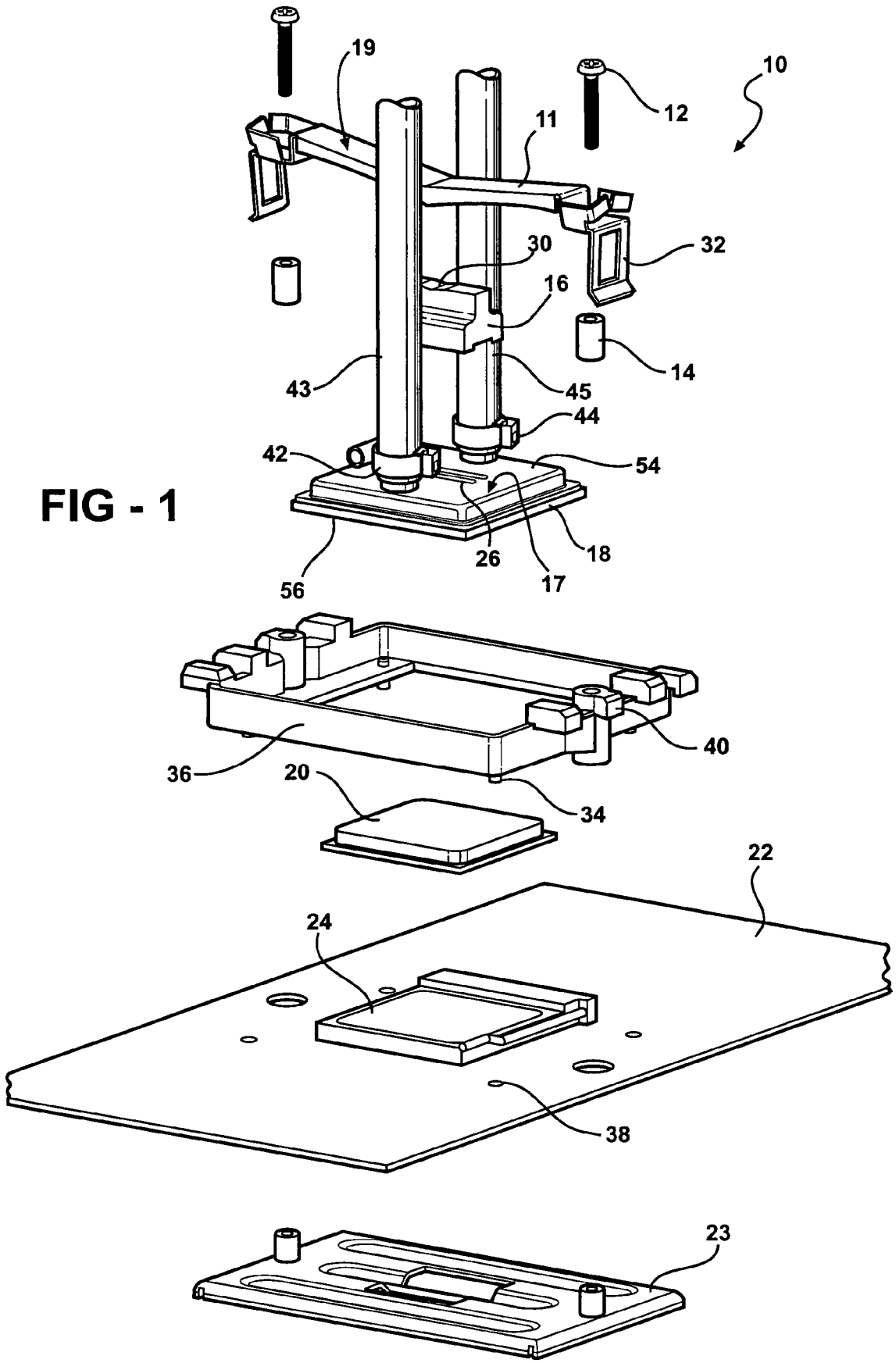
FIG. 1 is an exploded view of the heat sink assembly.
Figure 2:
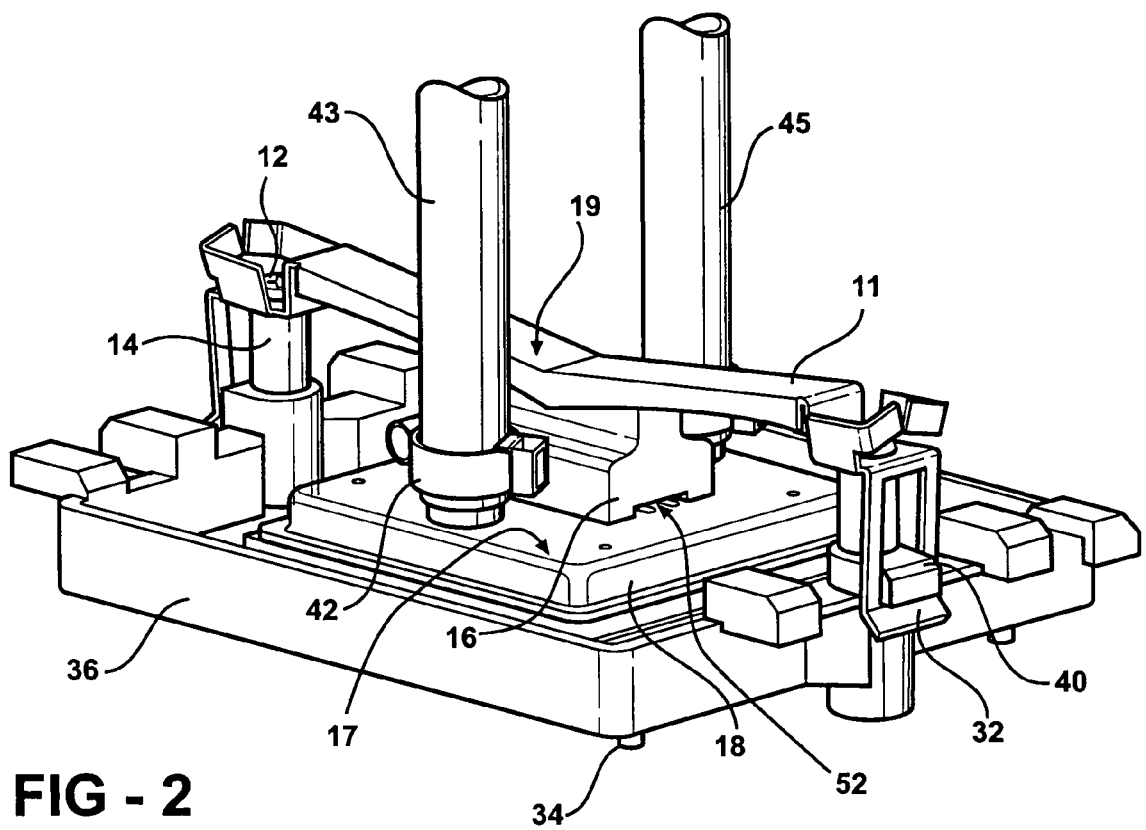
FIG. 2 is perspective view of the block mounted on the heat transfer device according to the present invention.

Referring to FIG. 1, a heat transfer assembly 10 is shown and comprises of an electronic component 20 attached to an attachment point 24 disposed on a circuit board 22. Additionally, a heat transfer device 17 consisting of a cold plate 18 having a first side 54 and a second side 56 and further including an inlet valve 42, inlet hose 43, outlet valve 44 and an outlet hose 45. A clamping mechanism 19 consisting of a clip 11 that applies a downward force against a block 16 after the clip 11 is fastened to a support 23. Preferably, the clip 11 consists of a locking tab 32 extending downward and is disposed on each end of the clip 11. The locking tab 32 is placed over a detent 40 disposed on a retainer frame 36. By attaching the locking tab 32 to the retainer frame 36, a clamp is formed between the clip 11 and retainer frame 36 to hold a spacer 14, the block 16, and the cold plate 18 in place for mounting these elements over the electronic component 20.

The clip 11, the retention frame 36, the spacer 14, the circuit board 22 and support 23 receive a screw 12 that threadedly engages the support 23 to sandwich these elements together. Alternatively, any fastening mechanism may be used in fastening these elements to the support 23. The spacer 14 will limit the dampening force of the screw 12 and allow the screw 12 to bottom out which ensures a nominal force between the clip 11 and block 16. By ensuring a predetermined or nominal force, damage to the electronic component 20 is avoided. To aid the operator during the fastening process, the retainer frame 36 further includes a plurality of indexing fingers 34 which engage a plurality of slots 38 disposed on the circuit board 22. The engagement between the indexing fingers 34 and the slots 38 prevent lateral movement between the base of the retainer frame 36 and the circuit board 22 during the fastening operation.

Referring to FIGS. 1, 2, 4 and 5; the block 16 contains a grooved notch 30 which allows for the clip 11 to rest on top of the block 16. During the fastening operation, the clip 11 provides force against the block 16. In turn, the block 16 applies pressure against the first side 54 of the cold plate 18 resulting in contact between the second side 56 of the cold plate 18 and the electronic component 20. A thermal compound (not shown) is applied between the electronic component 20 and the second side 56 of the cold plate 18 to increase the thermal transfer between the two elements.

Figure 3:
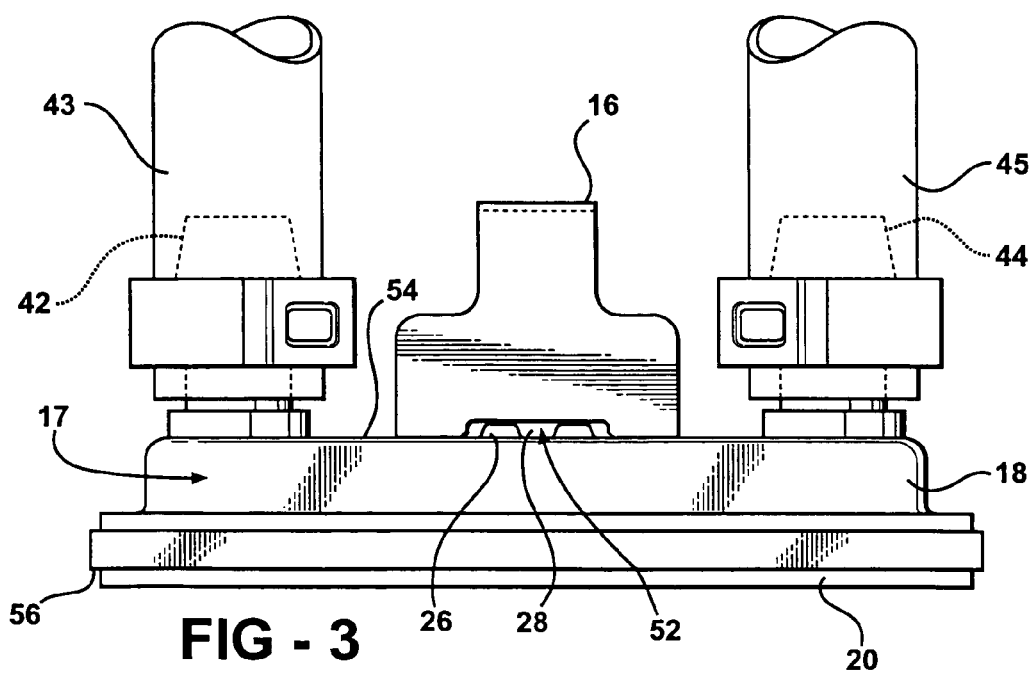
FIG. 3 is a cross sectional view of the block as it mounts on the heat sink device.
Figure 4:
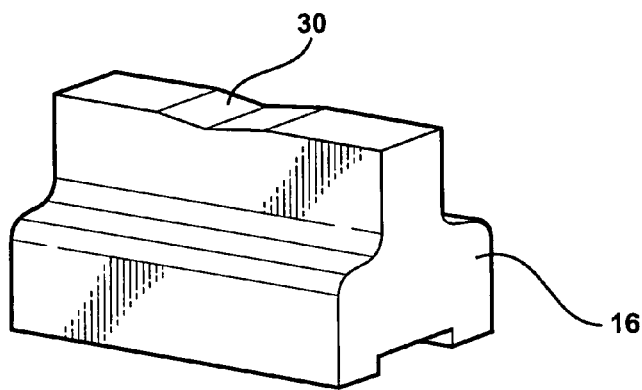
FIG. 4 is a perspective view of the block.
Figure 5:
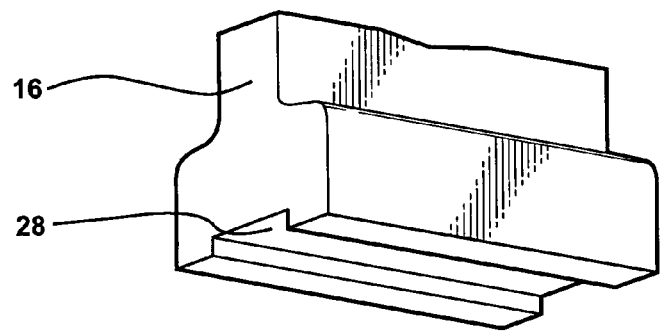
FIG. 5 is a view of the block of showing the groove disposed at the base.

Referring to FIG. 3, to ensure adequate contact between the cold plate 18 and the electronic component 20, a locating mechanism 52 consisting of a plurality of tongues 26 and a groove 28 which is placed between the block 16 and the cold plate 18. The tongues 26 are disposed parallel to one another, however alternative embodiments of heat sink assemblies may include various configurations related to the positioning of the tongues with respect to the groove. Furthermore, a plurality of grooves 28 may be used where an individual groove 28 will fit over each tongue 26. By using a locating mechanism 52 to place the block 16 on the cold plate 18, different block 16 designs may be utilized to apply localized pressure onto the cold plate 18. This is apparent as the area of the block 16 in direct contact with the cold plate 18 generates a greater force than the area of the block 16 not in contact with the cold plate 18. This is optimal for targeting specific cross-sections of the electronic component 20 which generates more heat than other regions.

Figure 6:
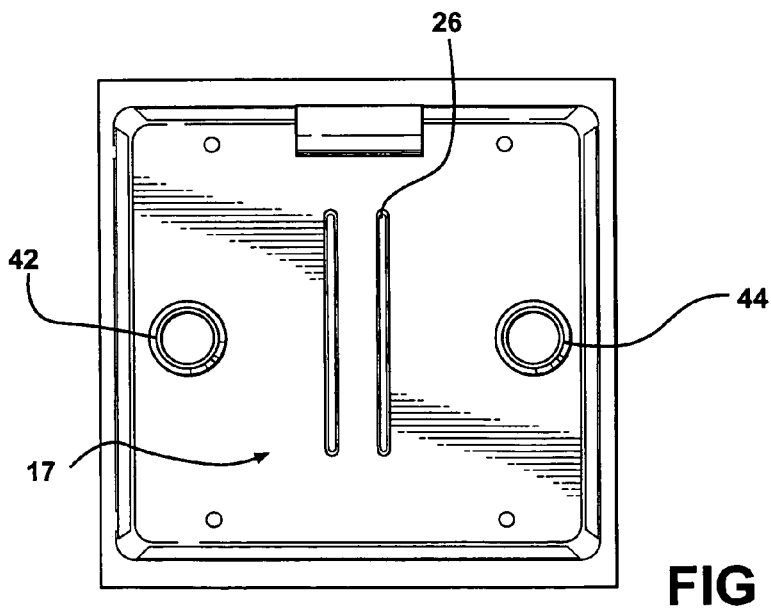
FIG. 6 is a top view of the cold plate.

Referring to FIGS. 3 and 6, as heat is generated from the electronic component 20, liquid coolant (not shown) enters the cold plate 18 through an inlet hose 43 attached to an inlet valve 42. As the liquid coolant flows through the cold plate 18 the excess heat is removed and carried away by the liquid coolant as it exits the cold plate 18 through an outlet hose 45 attached to an outlet valve 44. By circulating liquid coolant, the cold plate 18 is able to moderate and maintain a proper operational temperature for the electronic component 20.

Obviously, many modifications and variations of the present invention are possible in light of the above teachings. The invention may be practiced otherwise than as specifically described within the scope of the appended claims.

What is claimed is:

1. A heat transfer assembly for increasing thermal energy transfer comprising:
   an electronic component;
   a circuit board including an attachment point for supporting said electronic component;
   a heat transfer device having a first side and a second side disposed against said electronic component for transferring thermal energy away from said electronic component;
   a block disposed over said first side of said heat transfer device;
   a clamping mechanism for urging said heat transfer device toward said electronic component; and
   a locating mechanism for locating said block on said heat transfer device to increase the thermal energy transfer between said heat transfer device and said electronic component, wherein said locating mechanism comprises at least one tongue and at least one groove for receiving said tongue.

2. An assembly as set forth in claim 1 including a plurality of said tongues and a plurality of said grooves.

3. An assembly as set forth in claim 2 wherein said plurality of tongues and said plurality of grooves are parallel to one another.

4. An assembly as set forth in claim 1 wherein said heat transfer device comprises a cold plate.

5. An assembly as set forth in claim 4 wherein said cold plate includes an inlet valve and an outlet valve attached to said cold plate and a chamber inside said cold plate to provide fluid communication therebetween.

6. An assembly as set forth in claim 1 wherein said clamping mechanism comprises of a clip mounted over said block, wherein said block is notched to receive said clip.

7. An assembly as set forth in claim 6 wherein said clip includes a main bar with a locking tab extending downward disposed at opposite ends of said main bar.

8. An assembly as set forth in claim 1 further comprising of at least one spacer.

9. An assembly as set forth in claim 1 further comprising a retainer frame wherein said retainer frame includes a detent and a plurality of indexing fingers.

10. An assembly as set forth in claim 8 wherein said locking tab is secured over said detent to couple said retainer frame to said clip for clamping said block, said heat transfer device and said spacer.

11. An assembly as set forth in claim 10 further comprising a support, wherein said clip, said retention frame, said spacer, said circuit board and said support at least one screw that threadedly engages said support are clamped together by.

12. An assembly as set forth in claim 11 wherein said spacer is configured to limit the dampening force of said screw.

13. An assembly as set forth in claim 9 wherein said circuit board comprises of a plurality of slots.

14. An assembly as set forth in claim 13 wherein said slots receive said indexing fingers to prevent lateral movement between said retainer frame and said circuit board while applying said screw.

* * * * *